United States Patent
Zhou et al.

(10) Patent No.: US 9,515,628 B2
(45) Date of Patent: Dec. 6, 2016

(54) OPEN-GAIN TRANS-IMPEDANCE AMPLIFIER WITH PROGRAMMABLE INPUT IMPEDANCE

(75) Inventors: Dacheng Zhou, Fort Collins, CO (US); Daniel A. Berkram, Loveland, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 154 days.

(21) Appl. No.: 14/379,638

(22) PCT Filed: Apr. 25, 2012

(86) PCT No.: PCT/US2012/035009
§ 371 (c)(1),
(2), (4) Date: Aug. 19, 2014

(87) PCT Pub. No.: WO2013/162552
PCT Pub. Date: Oct. 31, 2013

(65) Prior Publication Data
US 2015/0003843 A1    Jan. 1, 2015

(51) Int. Cl.
*H04B 10/00*  (2013.01)
*H03G 3/30*  (2006.01)
(Continued)

(52) U.S. Cl.
CPC ............ *H03G 3/3084* (2013.01); *H03F 1/086* (2013.01); *H03F 1/56* (2013.01); *H03F 3/08* (2013.01); *H03F 3/082* (2013.01); *H04B 10/6931* (2013.01); *H03F 2200/222* (2013.01); *H03F 2200/255* (2013.01); *H03F 2200/405* (2013.01); *H03F 2200/72* (2013.01)

(58) Field of Classification Search
CPC ............ H03G 3/3084; H03F 3/08; H03F 1/56; H03F 1/086; H03F 3/082; H03F 2200/222; H03F 2200/255; H03F 2200/405; H03F 2200/72; H04B 10/6931
See application file for complete search history.

(56) References Cited

U.S. PATENT DOCUMENTS

| | | | | |
|---|---|---|---|---|
| 4,029,976 A | * | 6/1977 | Fish | ........................ H03F 3/087 327/514 |
| 5,811,934 A | * | 9/1998 | Bunk | ........................ H01K 1/28 313/344 |

(Continued)

FOREIGN PATENT DOCUMENTS

| | | |
|---|---|---|
| CN | 1669249 | 9/2005 |
| CN | 101079602 | 11/2007 |
| CN | 101807892 | 8/2010 |

OTHER PUBLICATIONS

International Searching Authority, The International Search Report and the Written Opinion, Dec. 12, 2012, 9 Pages.

*Primary Examiner* — Danny Leung
(74) *Attorney, Agent, or Firm* — Conley Rose, P.C. (PAT)

(57) ABSTRACT

In at least some examples, a communication device includes a photo-diode to convert an optical signal into an electrical current and an open-gain trans-impedance amplifier to amplify the electrical current. The communication device also includes a transmission line between the photo-diode and the open-gain trans-impedance amplifier. The open-gain trans-impedance amplifier includes a programmable input impedance that has been matched to an impedance of the transmission line.

18 Claims, 8 Drawing Sheets

(51) Int. Cl.
*H03F 1/08* (2006.01)
*H03F 3/08* (2006.01)
*H03F 1/56* (2006.01)
*H04B 10/69* (2013.01)

(56) References Cited

U.S. PATENT DOCUMENTS

| | | |
|---|---|---|
| 5,811,984 A | 9/1998 | Long et al. |
| 6,037,841 A | 3/2000 | Tanji et al. |
| 6,275,114 B1 * | 8/2001 | Tanji ............... H03F 3/082 250/214 A |
| 6,307,196 B1 * | 10/2001 | Thompson ............ G01J 1/44 250/214 A |
| 6,384,689 B1 * | 5/2002 | Kimura ............. H03F 3/082 250/214 A |
| 6,862,322 B1 * | 3/2005 | Ewen ................. H03F 3/087 340/855.7 |
| 6,873,703 B1 * | 3/2005 | Enriquez ........... H04M 1/738 327/560 |
| 7,151,411 B2 * | 12/2006 | Martin ............... H03F 1/0211 330/305 |
| 7,652,537 B2 * | 1/2010 | Ngo .................... H03F 1/56 330/282 |
| 7,657,191 B2 * | 2/2010 | Killmeyer ............ H03F 1/34 250/214 A |
| 7,688,141 B1 * | 3/2010 | Aram ................. H03F 1/08 330/253 |
| 8,022,736 B2 * | 9/2011 | Chang ............... H04L 25/028 327/108 |
| 2003/0015707 A1 * | 1/2003 | Bosco ............... H01L 21/8258 257/73 |
| 2004/0208207 A1 | 10/2004 | Kasper et al. |
| 2007/0273446 A1 | 11/2007 | Kim et al. |
| 2008/0205906 A1 * | 8/2008 | Murata ............. H04B 10/6931 398/208 |
| 2009/0052910 A1 * | 2/2009 | Schemmann ....... H04B 10/675 398/208 |
| 2012/0301151 A1 * | 11/2012 | Hu .................... H04B 10/40 398/135 |
| 2015/0003843 A1 * | 1/2015 | Zhou ................. H03G 3/3084 398/214 |

* cited by examiner

OPEN-GAIN TRANS-IMPEDANCE AMPLIFIER WITH PROGRAMMABLE INPUT IMPEDANCE

BACKGROUND

For optical communications, the input optical pulse from the optical fiber is received and converted into electrical current through as photo-diode. A trans-impedance amplifier (TIA) may then be employed to convert input current into voltage output. Since the electrical current output by the photo-diode is very small, (e.g., on the order of 20 µA), the TIA is placed next to the photo-diode.

BRIEF DESCRIPTION OF THE DRAWINGS

For a detailed description of illustrative examples of the disclosure, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

DETAILED DESCRIPTION

Due to imperfect integrated circuit manufacturing processes, the input impedance of a trans-impedance amplifier (TIA) varies regardless of efforts to design for a particular input impedance. Also transmission line impedance may vary due to variations and imperfections in the materials/ designs for transmission lines. If the TIA input impedance does not match the transmission line impedance, the input signal will be distorted due to reflection noise. In an optical communications application, the output current from a photo-diode is very small (e.g., 20 µA to 70 µA) and any signal distortion makes it difficult or impossible to recapture the data. Instead of placing a TIA close to the photo-diode to avoid signal distortion to the very small current output from a photo-diode, disclosed examples use a TIA with a programmable input impedance that is adjusted to match a transmission line impedance. Further, in some examples, MOSFET transistors may be used rather than bipolar devices.

A TIA with a programmable input impedance is referred to herein as a programmable TIA (PTIA). In at least some disclosed examples, an open-gain PTIA is part of a communication device that receives optical signals and processes corresponding electrical signals. In the communication device, a photo-diode converts optical signals to electrical current. The electrical current from the photo-diode is received by the open-gain PTIA via a transmission line. The transmission line between the photo-diode and the open-gain PTIA is due to, for example, the open-gain PTIA being on integrated circuit (IC) chip that is separate from the photo-diode. In some examples, the open-gain PTIA is implemented on an IC chip with other receiver components to reduce overall cost, power, and latency requirements for the receiver. With the open-gain PTIA separated from the photo-diode by a transmission line, the impedance of the transmission line and other noise coupling issues need to be addressed. The proposed open-gain PTIA resolves signal reflection problems due to non-matched transmission line impedance and open-gain PTIA input impedance by adjustment of the open-gain PTIA input impedance to match the impedance of the transmission line. Adjustments to the input impedance of the open-gain PTIA may occur either through post-silicon calibration (before the chip with the open-gain PTIA is installed in a consumer communication device) or through system programming (after the chip with the open-gain PTIA is installed in a consumer communication device). In either case, the adjustments may be based on an analysis of the output signal for the open-gain PTIA. The disclosed PTIA examples replace the existing technique of placing a TIA next to the photo-diode to avoid signal distortion to the very small current output from the photo-diode.

Figure 1:
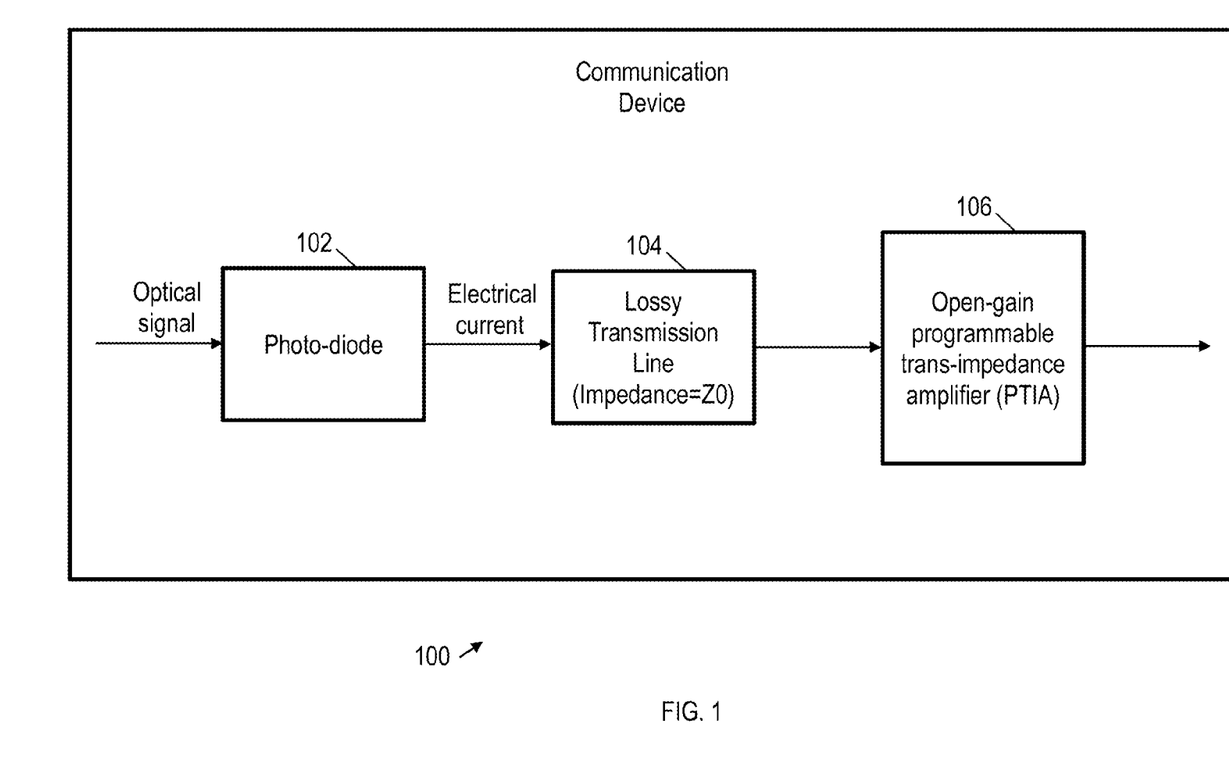
FIG. 1 shows a communication device in accordance with an example of the disclosure.

FIG. 1 shows a communication device 100 in accordance with an example of the disclosure. The communication device 100 corresponds to an end-node (data sink) or routing device of an optical communication network. As shown, the communication device 100 comprises a photo-diode 102 that receives an optical signal and outputs a corresponding electrical current. The electrical current is propagated via a lossy transmission line 104 (with impedance=Z0) to an open-gain PTIA 106. The open-gain PTIA 106 converts the electrical current received from the photo-diode 102 via the lossy transmission line 104 to a voltage. As disclosed herein, the input impedance of the open-gain PTIA 106 is adjusted to match to an impedance of the transmission line.

In some embodiments, input impedance of the open-gain PTIA 106 is adjusted based on a control signal to a variable resistor. The control signal is based on analysis of an output signal of the open-gain PTIA 106 either before or after the open gain PTIA 106 is installed in the communication device 100.

In some examples, the open-gain PTIA 106 comprises four amplifier stages, including a common gate amplifier stage followed by two common source amplifier stages. Further, the open-gain PTIA 106 may comprise a low-pass filter to feed the common mode signal as bias control for the common gate amplifier of the open-gain PTIA 106. Furthermore, this common mode signal can generate a common mode reference voltage for the PTIA output. Therefore, low-pass filtering may be omitted for the output signal of the open-gain PTIA 106. In some examples, the open-gain PTIA 106 is part of an integrated circuit that is separate from the photo-diode 102 and the transmission line 104. For example, the photo-diode 102 may be pan of an optical module. Meanwhile, the transmission line 104 may correspond to semiconductor packaging and/or a conductive trace between an integrated circuit with the open-gain PTIA 106 and the photo-diode 102.

To summarize, for the open-gain PTIA 106, the first amplifier stage provides gain stage and voltage level shifting, while the second and third amplifier stages provide further gain stage. The fourth amplifier stage provides voltage level shifting for the output signal and the common mode signal. A low-pass filter is used to feed back the common mode signal to the common gate stage and output common mode reference stage. The programmable input impedance is based on equivalent resistance of R_term and ($1/g_m1$) in parallel, where R_term is a variable resistor value and $g_m1$ is the transconductance of the transistor for the first amplifier stage. The value for R_term may be determined, for example, during a wafer test in which the PTIA input voltage is measured with zero current applied and also with a small current applied to the TIA input. The voltage difference is compared with a target voltage (V=I*Z0), where Z is the transmission line impedance to be matched. If the measured voltage value is higher than the target voltage, R_term should be reduced. Alternatively, if the measured voltage is lower than the target voltage, R_term should be increased. Another way to determine the value of R_term is to analyze the eye-opening corresponding to the output of the open-gain PTIA 106, and to sweep across the available values for R_term (e.g., from low to high) until an optimal setting is determined.

Figure 2:
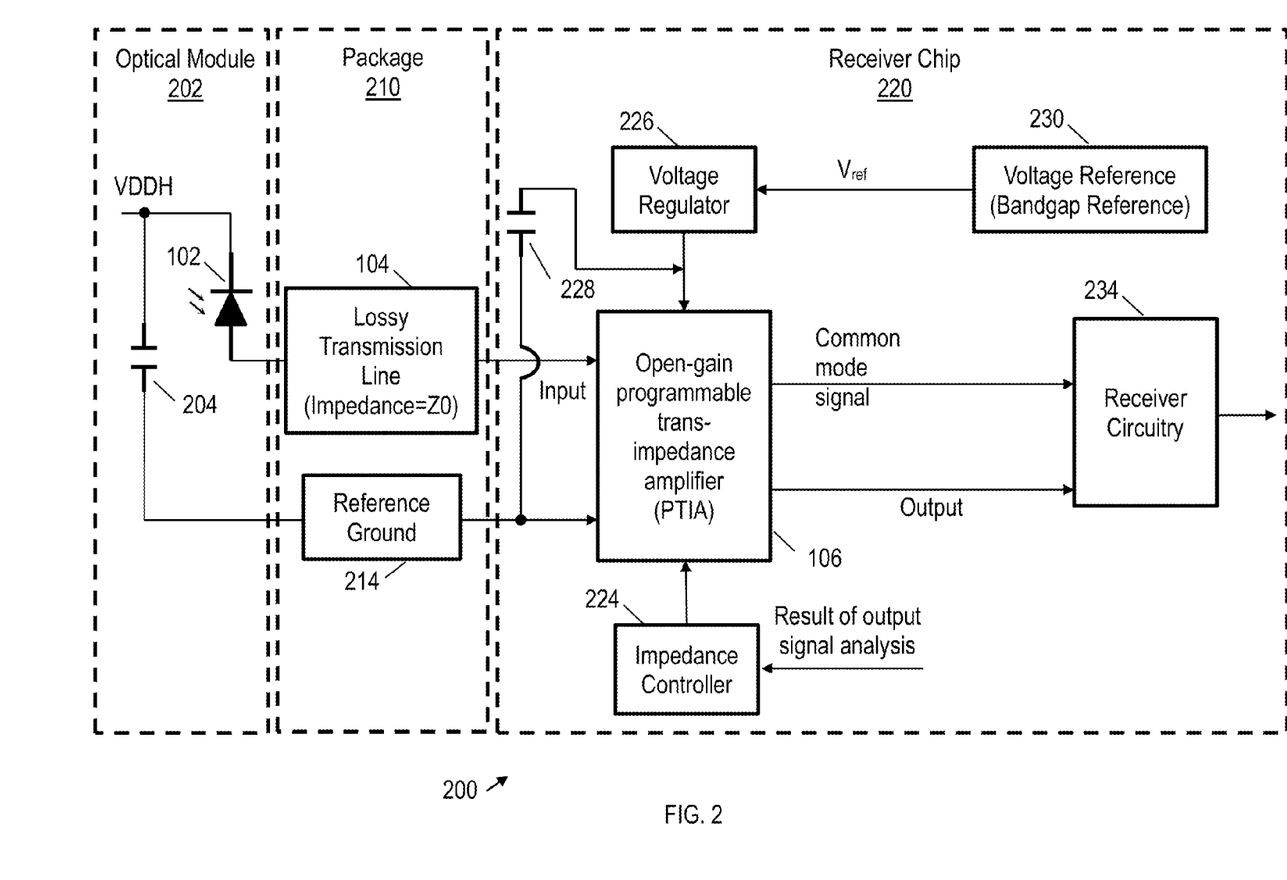
FIG. 2 shows an arrangement of communication device components in accordance with an example of the disclosure.

FIG. 2 shows an arrangement 200 of communication device components in accordance with an example of the disclosure. Without limitation to other examples, the arrangement 200 may be used for the communication device 100 of FIG. 1. In the arrangement 200, various components are shown to be part of an optical module 202, a package 210, and a receiver chip 220. More specifically, the optical module 202 comprises a capacitor 204 and a photo-diode 102 as described for the communication device 100 of FIG. 1. Further, the package 210 comprises a reference ground 214 and a lossy transmission line 104 as described for the communication device 100 of FIG. 1. Further, the receiver chip 220 comprises various components as well as an op PTIA 106 as described for the communication device 100 of FIG. 1.

As shown, the open-gain PTIA 106 receives its input from the lossy transmission line 104 and also receives the reference ground 214 via package 210. The receiver chip 220 also comprises a voltage reference 230, a voltage regulator 226, and a capacitor 228 to provide a current return path to the open-gain PTIA 106. The input impedance of the open-gain PTIA 106 is adjustable by impedance controller 224, which provides a control signal to the open-gain PTIA 106. The control signal from the impedance controller 224 is based on instructions or information corresponding to the result of analyzing the output signal of the open-gain PTIA 106. As shown, the open-gain PTIA 106 outputs a common mode signal and an output signal to receiver circuitry 234 of the receiver chip 220. The receiver circuitry 234 may perform, for example, various data recovery operations.

Figure 3:
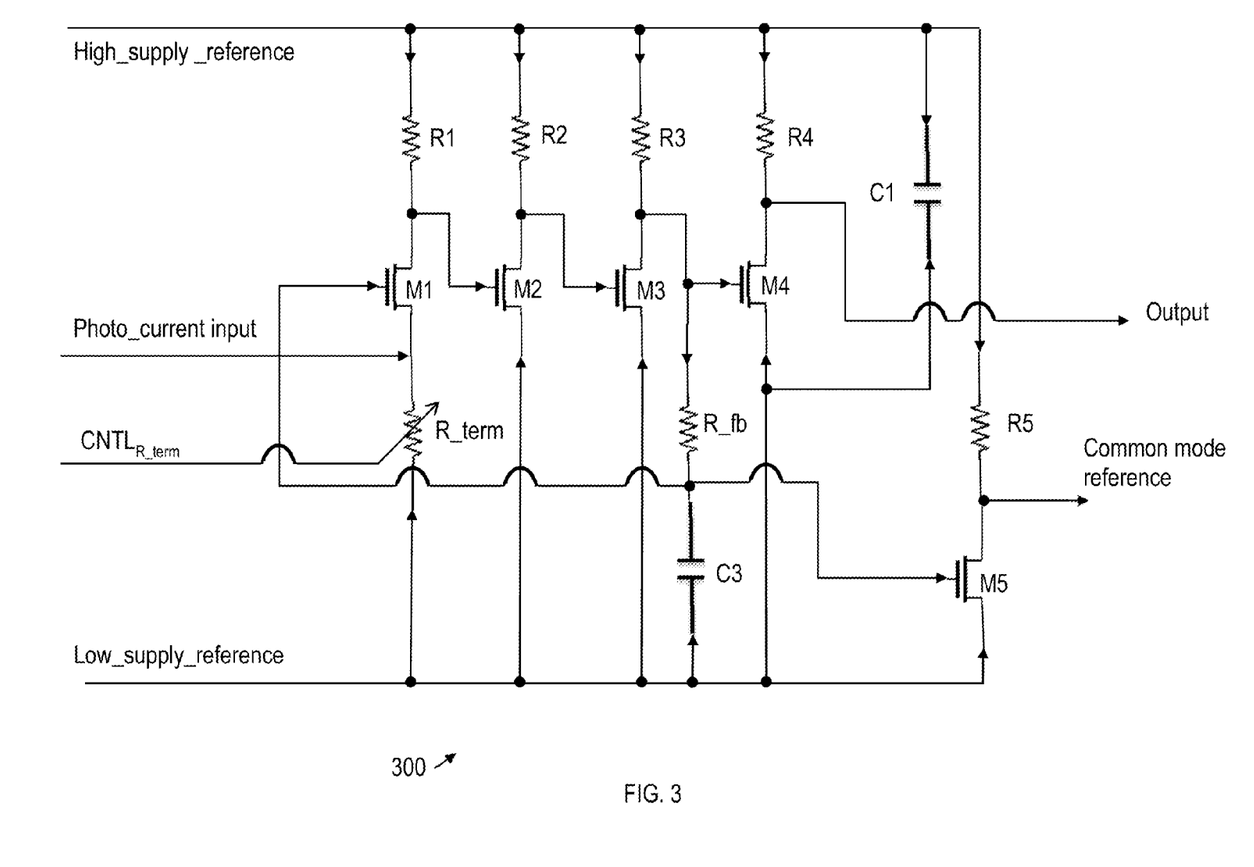
FIG. 3 shows a programmable trans-impedance amplifier (PTIA) architecture in accordance with an example of the disclosure.

FIG. 3 shows an open gain PTIA architecture 300 in accordance with an example of the disclosure. As shown, the open-gain PTIA architecture 300 comprises transistors M1-M5 with respective drain-side resistors R1-R5 between a high_supply_reference and transistors M1-M5. In the open-gain PTIA architecture 300, a variable resistor (R_term) is placed between a low-supply reference and a source of transistor M1. The variable resistor R_term is controlled by a control signal ($CTRL_{r\_term}$) as described herein. In the open-gain PTIA architecture 300, a feedback resistor (R_fb) and capacitor C3 are placed between a drain of transistor M3 and the low_supply_reference. The signal between feedback resistor R_fb and capacitor C3 is supplied to the gates of M1 and M5. In the open-gain PTIA architecture 300, capacitor C1 is placed between a source of M4 and the high_supply_reference.

The open-gain PTIA architecture 300 of FIG. 3 corresponds to a four stage amplifier. More specifically, M1 operates as a common gate amplifier and provides gain stage and voltage level shifting. Meanwhile, M2 and M3 operate as a common source amplifier to provide further gain stage. Further, M4 and M5 operate as a last stage common source amplifier to provide voltage level shifting for the output signal and common mode signal respectively. The feedback resistor R_fb and capacitor C3 operate as a low-pass filter to provide a common mode signal back into the gate of M1. In this manner, the transistors M1-M5 are placed in their optimal operation points. Further, voltage and input swing variations are prevents while M1 operates in its saturation region to have a high 1/gm value.

In the open-gain PTIA architecture 300, the variable resistor R_term corresponds to a programmable passive resistor that is adjusted so that the PTIA input impedance matches a transmission line output impedance. The matching may be achieved by adjusting the resistor R_term directly while keeping the 1/gm large to have small impact on the input impedance. Further, by matching R4=R5 and M4=M5, the common mode level has been shifted to the proper level such that it matches the output. Therefore, additional low-pass filtering is not required for the output.

With the open-gain PTIA architecture 300, programmable input impedance adjustment is utilized to match the transmission line impedance and reduce reflection. Further, the open-gain PTIA architecture 300 utilizes a common mode voltage feedback structure to tolerate high process and voltage variation as well as swing control. Further, the open-gain PTIA architecture 300 does not use any inductor or cascading structure and thus size is reduced and low voltage operation is possible.

Without limitation to other examples, various values for the open-gain PTIA architecture 300 are provided herein. For example, the input impedance $R_{ptia}$=R_term/1 $g_m1$), Further, 1 $g_m1$>20×Rterm such that $R_{ptia}$=R_term, which is trimable by Rtrim_cntl so that $R_{ptia}$=Z0 (the transmission line impedance). Further, M4=M5 and R4=R5 to provide level shifting and common mode output. Further, M1=6μ/80 n, and M3=M4=M5=4.2μ/40 n. Further, R1=3.2 kΩ, R2=1.6 kΩ, and R3=R4=R5=1 kΩ. Further, R_term varies between approximately 40Ω to 100Ω to match to Z0=75Ω. Further, R_fb=25 kΩ, C3=12 pF, and C1=200 pF. Further, the photo_current input is approximately 20 μA to 100 μA.

Figure 4:
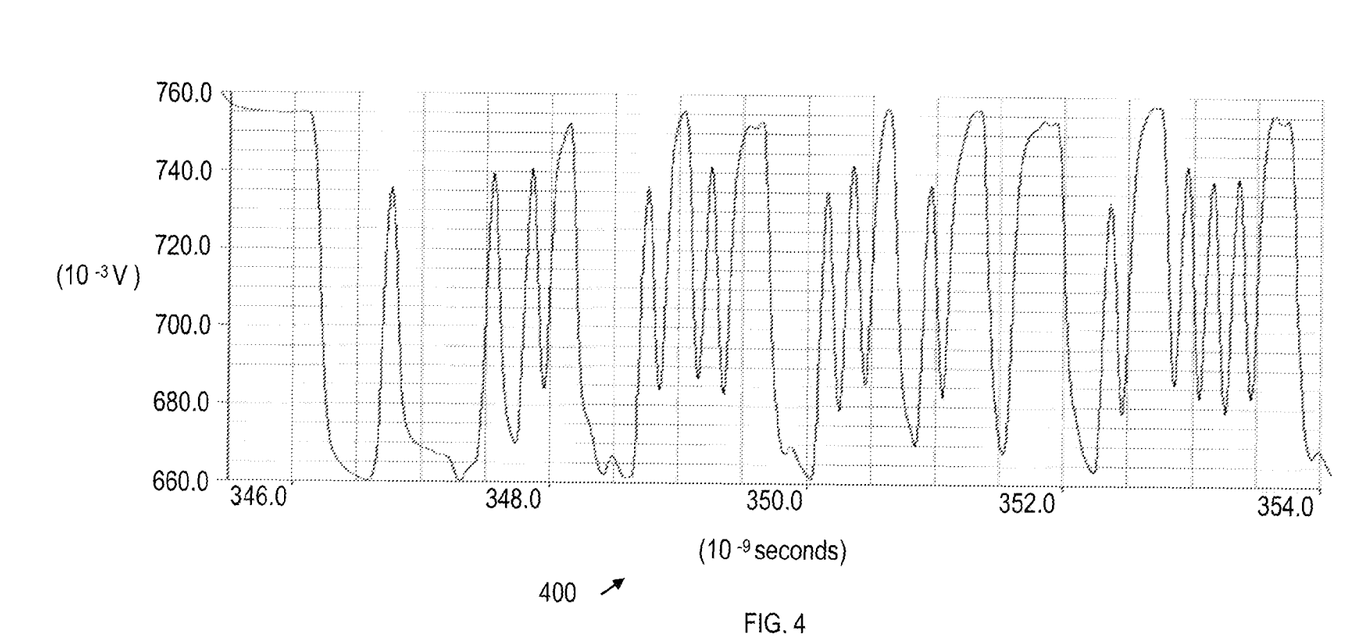
FIG. 4 shows an output signal of an open-gain PTIA in accordance with an example of the disclosure.

FIG. 4 shows an output signal 400 of an open-gain PTIA in accordance with an example of the disclosure. As shown, the output signal 400 ranges between $660 \times 10^{-3}$ to $760 \times 10^{-3}$ volts (0.66 to 0.76 volts) during a time period from $346 \times 10^{-9}$ to $354 \times 10^{-9}$ (approximately 0.1 µs).

Figure 5:
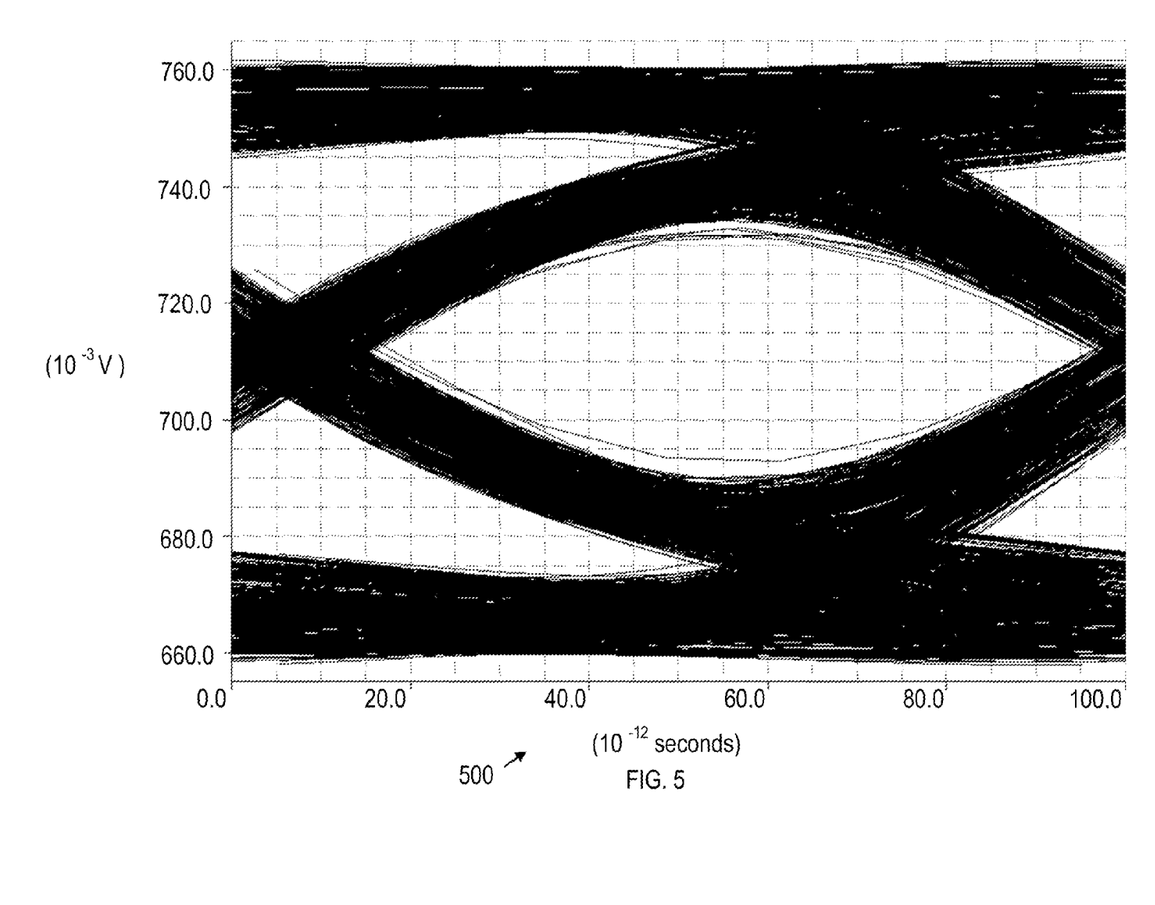
FIG. 5 shows an eye diagram corresponding to the output signal of FIG. 4 in accordance with an example of the disclosure.

FIG. 5 shows an eye diagram 500 corresponding to the output signal 400 of FIG. 4. In the eye diagram 500, the quality of the output signal 400 can be assessed as signal transitions occur between $660 \times 10^{-3}$ to $760 \times 10^{-3}$ volts (0.66 to 0.76 volts) during a time window of $100 \times 10^{-12}$ seconds (100 picoseconds).

Figure 6:
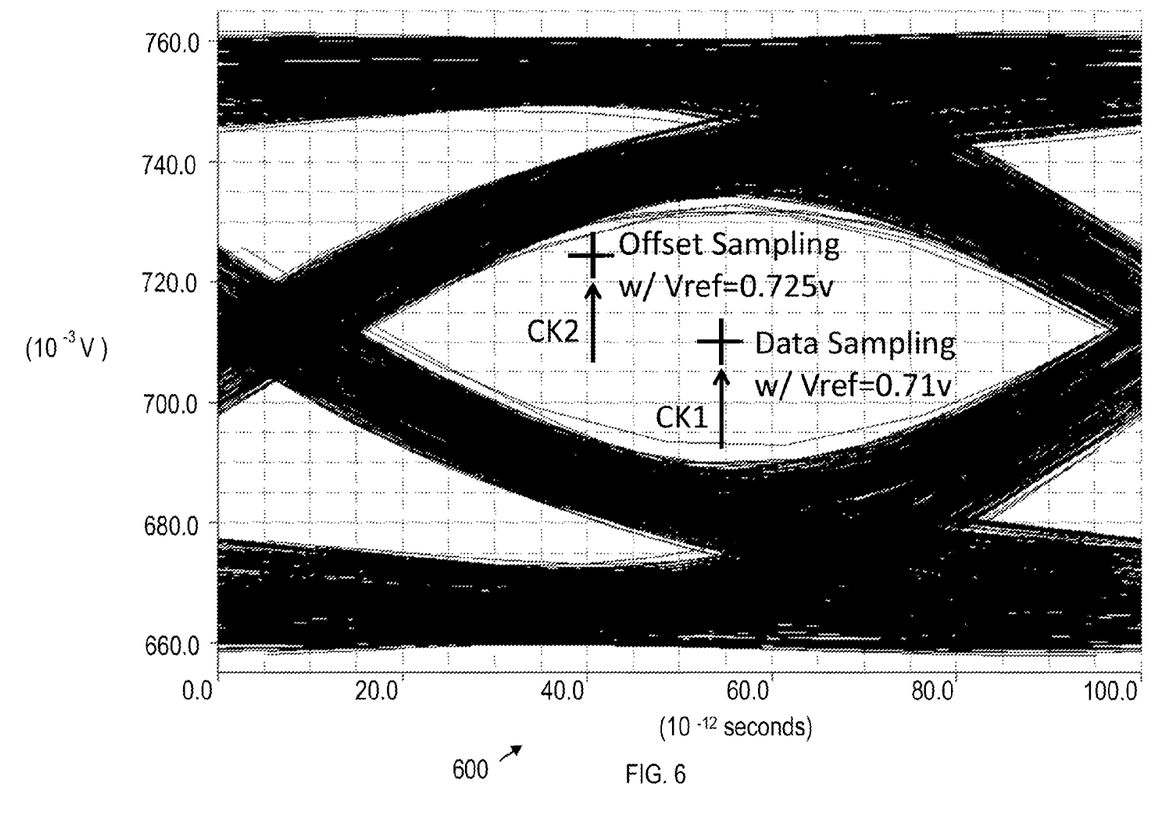
FIG. 6 shows an analysis of the eye diagram of FIG. 5 in accordance with an example of the disclosure.

FIG. 6 shows an analysis 600 of the eye diagram 500 of FIG. 5 in accordance with an example of the disclosure. In the analysis 600, the signal transitions between $660 \times 10^{-3}$ to $760 \times 10^{-3}$ volts (0.66 to 0.76 volts) during a time window of $100 \times 10^{-12}$ seconds (100 picoseconds) are shown as described for the eye diagram 600 of FIG. 5. In addition, analysis 600 shows an offset sampling with $V_{ref}=0.725$ V and a data sampling with $V_{ref}=0.71$ V. The error in the output signal 400 can be determined by XORing the offset sampling and the data sampling. Thereafter, the error can be reduced by adjustment of the input impedance of the open-gain PTIA 106 as described herein.

Figure 7:
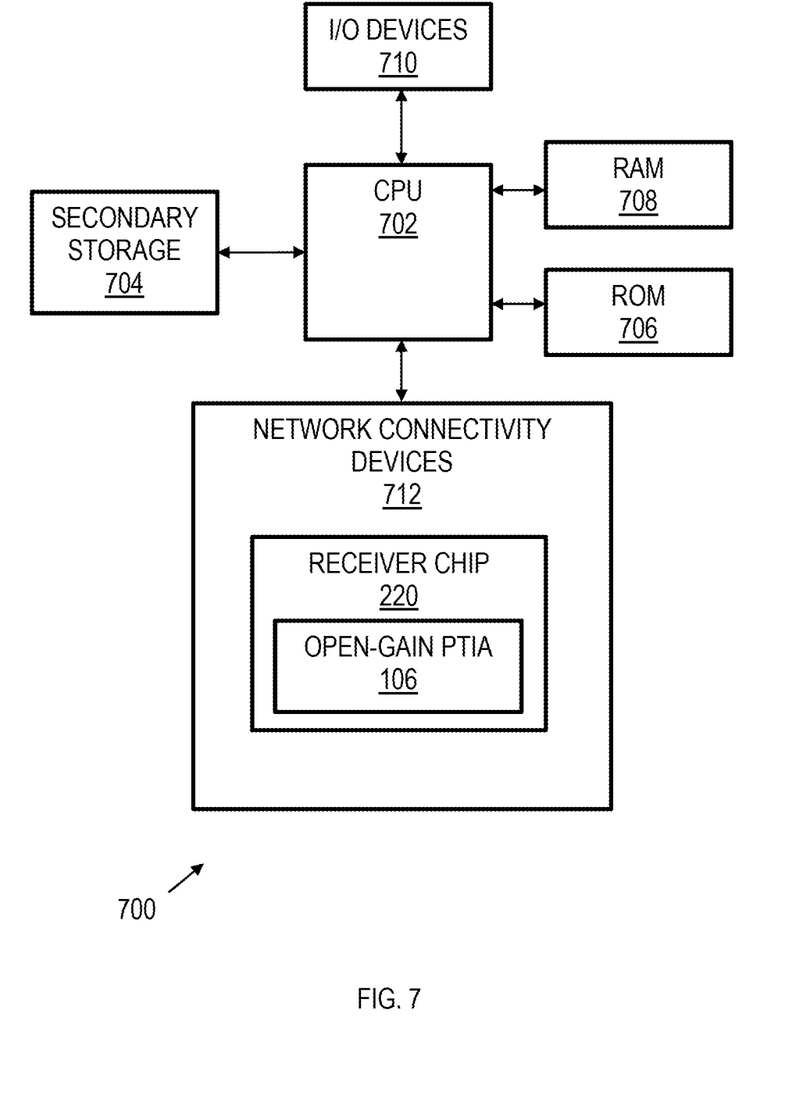
FIG. 7 shows a computer system in accordance with an example of the disclosure.

FIG. 7 shows a computer system 700 in accordance with an example of the disclosure. The computer system 700 may correspond to part of an end-node (data sink) or routing device of an optical communication network. In other words, the components shown for the computer system 700 may be part of a communication device 100 as described for FIG. 1. After reception of data from an optical communication network, the computer system 700 may store, process, and execute the received data.

As shown, the computer system 700 includes a processor 702 (which may be referred to as a central processor unit or CPU) that is in communication with memory devices including secondary storage 704, read only memory (ROM) 706, random access memory (RAM) 708, input/output (I/O) devices 710, and network connectivity devices 712. The processor 702 may be implemented as one or more CPU chips.

It is understood that by programming and/or loading executable instructions onto the computer system 700, at least one of the CPU 702, the RAM 708, and the ROM 706 are changed, transforming the computer system 700 in part into a particular machine or apparatus having the novel functionality taught by the present disclosure. It is fundamental to the electrical engineering and software engineering arts that functionality that can be implemented by loading executable software into a computer can be converted to a hardware implementation by well-known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an application specific integrated circuit (ASIC), because for large production runs the hardware implementation may be less expensive than the software implementation. Often a design may be developed and tested in a software form and later transformed, by well-known design rules, to an equivalent hardware implementation in an application specific integrated circuit that hardwires the instructions of the software. In the same manner as a machine controlled by a new ASIC is a particular machine or apparatus, likewise a computer that has been programmed and/or loaded with executable instructions may be viewed as a particular machine or apparatus.

The secondary storage 704 is typically comprised of one or more disk drives or tape drives and is used for non-volatile storage of data and as an over-flow data storage device if RAM 708 is not large enough to hold all working data. Secondary storage 704 may be used to store programs which are loaded into RAM 708 when such programs are selected for execution. The ROM 706 is used to store instructions and perhaps data which are read during program execution. ROM 706 is a non-volatile memory device which typically has a small memory capacity relative to the larger memory capacity of secondary storage 704. The RAM 708 is used to store volatile data and perhaps to store instructions. Access to both ROM 706 and RAM 708 is typically faster than to secondary storage 704. The secondary storage 704, the RAM 708, and/or the ROM 706 may be referred to in some contexts as computer readable storage media and/or non-transitory computer readable media.

I/O devices 710 may include printers, video monitors, liquid crystal displays (LCDs), touch screen displays, keyboards, keypads, switches, mice, track balls, voice recognizers, card readers, paper tape readers, or other well-known input devices.

The network connectivity devices 712 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards such as code division multiple access (CDMA), global system for mobile communications (GSM), long-term evolution (LTE), worldwide interoperability for microwave access (Wi-MAX), and/or other air interface protocol radio transceiver cards, and other well-known network devices. As described herein, the computer system 700 may be part of an optical communication network. In such case, the network connectivity devices 712 support optical communication techniques. These network connectivity devices 712 may enable the processor 702 to communicate with the Internet or one or more intranets. With such a network connection, it is contemplated that the processor 702 might receive information from the network, or might output information to the network in the course of performing the above-described method steps. Such information, which is often represented as a sequence of instructions to be executed using processor 702, may be received from and outputted to the network, for example, in the form of a computer data signal embodied in a carrier wave. As shown, at least one of network connectivity devices 712 may comprise the receiver chip 220 and/or the open-gain PTIA 106 described herein.

Such information, which may include data or instructions to be executed using processor 702 for example, may be received from and outputted to the network, for example, in the form of a computer data baseband signal or signal embodied in a carrier wave. The baseband signal or signal embodied in the carrier wave, or other types of signals currently used or hereafter developed, may be generated according to several methods well known to one skilled in the art. The baseband signal and/or signal embodied in the carrier wave may be referred to in some contexts as a transitory signal.

The processor 702 executes instructions, codes, computer programs, scripts which it accesses from hard disk, floppy disk, optical disk (these various disk based systems may all be considered secondary storage 704), ROM 706, RAM 708, or the network connectivity devices 712. While only one processor 702 is shown, multiple processors may be present. Thus, while instructions may be discussed as executed by a processor, the instructions may be executed simultaneously, serially, or otherwise executed by one or multiple processors. Instructions, codes, computer programs, scripts, and/or data that may be accessed from the secondary storage 704, for example, hard drives, floppy disks, optical disks, and/or other device, the ROM 706, and/or the RAM 708 may be referred to in some contexts as non-transitory instructions and/or non-transitory information.

In an embodiment, the computer system 700 may comprise two or more computers in communication with each other that collaborate to perform a task. For example, but not by way of limitation, an application may be partitioned in such a way as to permit concurrent and/or parallel processing of the instructions of the application. Alternatively, the data processed by the application may be partitioned in such a way as to permit concurrent and/or parallel processing of different portions of a data set by the two or more computers. In an embodiment, virtualization software may be employed by the computer system 700 to provide the functionality of a number of servers that is not directly bound to the number of computers in the computer system 700. For example, virtualization software may provide twenty virtual servers on four physical computers. In an embodiment, the functionality disclosed above may be provided by executing the application and/or applications in a cloud computing environment. Cloud computing may comprise providing computing services via a network connection using dynamically scalable computing resources. Cloud computing may be supported, at least in part, by virtualization software. A cloud computing environment may be established by an enterprise and/or may be hired on an as-needed basis from a third party provider. Some cloud computing environments may comprise cloud computing resources owned and operated by the enterprise as well as cloud computing resources hired and/or leased from a third party provider.

Figure 8:
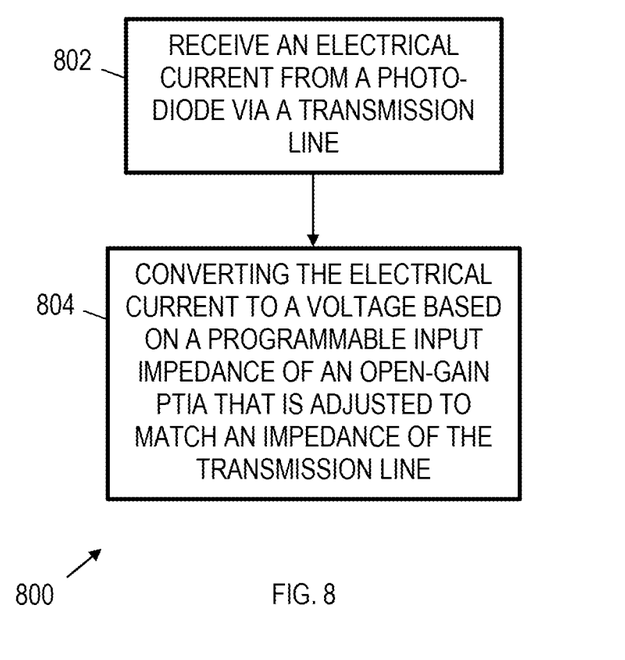
FIG. 8 shows a method in accordance with an example of the disclosure.

FIG. 8 shows a method 800 in accordance with an example of the disclosure. The method 800 may be performed, for example, by an open-gain PTIA as described herein. As shown, the method 800 comprises receiving an electrical current from a photo-diode via a transmission line (block 802). The electrical current is converted to a voltage based on a programmable input impedance of the open-gain PTIA at block 804, where the programmable input impedance of the open-gain PTIA is adjusted to match an impedance of the transmission line. As an example, adjusting the programmable input impedance of the open-gain PTIA may be based on a control signal to a variable resistor, where the control signal is set according to a signal quality analysis of an output signal of the open-gain PTIA.

To convert the electrical current voltage, the open-gain PTIA may operate a common gate amplification stage followed by two common source amplification stages. In some examples, converting the electrical current to a voltage also may comprise voltage level shifting at a last stage of amplification for an output signal and for a common mode signal of the open-gain trans-impedance amplifier. Converting the electrical current to a voltage also may comprise low-pass filtering the common mode signal fed back to a first amplifier stage of the open-gain PTIA, and omitting low-pass filtering for the output signal of the PTIA. For method 800, the open-gain PTIA is part of an integrated circuit that is separate from the photo-diode and the transmission line. The method 800 also may comprise performing any other operations for setting up or operating an open-gain PTIA separated from a photo-diode via a transmission line as described herein.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A communication device, comprising:
   a photo-diode to convert an optical signal into an electrical current;
   an open-gain trans-impedance amplifier to convert the electrical current to a voltage, a last stage of the open-gain trans-impedance amplifier providing voltage level shifting for an output signal and for a common mode signal of the open-gain trans-impedance amplifier; and
   a transmission line between the photo-diode and the open-gain trans-impedance amplifier,
   wherein the open-gain trans-impedance amplifier comprises a programmable input impedance that has been matched to an impedance of the transmission line.

2. The communication device of claim 1, wherein the programmable input impedance is adjusted based on a control signal to a variable resistor, and wherein the control signal is based on analysis of an output signal of the open-gain trans-impedance amplifier.

3. The communication device of claim 1, wherein the open-gain trans-impedance amplifier comprises four amplifier stages.

4. The communication device of claim 1, wherein the open-gain trans-impedance amplifier comprises a common gate amplifier stage followed by two common source amplifier stages.

5. The communication device of claim 1, wherein the open-gain trans-impedance amplifier comprises a low-pass filter to feed the common mode signal to a first amplifier stage of the open-gain trans-impedance amplifier, and wherein low-pass filtering is omitted for the output signal of the open-gain trans-impedance amplifier.

6. The communication device of claim 1, wherein the open-gain trans-impedance amplifier is part of an integrated circuit that is separate from the photo-diode and the transmission line.

7. A method for an open-gain trans-impedance amplifier, comprising:
   receiving an electrical current from a photo-diode via a transmission line; and converting the electrical current to a voltage based on a programmable input impedance of the open-gain trans-impedance amplifier, the converting including voltage level shifting at a last stage of amplification for an output signal and for a common mode signal of the open-gain trans-impedance amplifier, wherein the programmable input impedance is adjusted to match an impedance of the transmission line, wherein the open-gain trans-impedance amplifier is part of an integrated circuit that is separate from the photodiode and the transmission line.

8. The method of claim 7, further comprising:
adjusting the programmable input impedance based on a control signal to a variable resistor,
wherein the control signal is set according to a signal quality analysis of an output signal of the open-gain trans-impedance amplifier.

9. The method of claim 7, wherein converting the electrical current to a voltage comprises operating a common gate amplification stage followed by two common source amplification stages.

10. The method of claim 7, wherein converting the electrical current to a voltage comprises low-pass filtering the common mode signal fed back to bias voltage of a common gate amplifier stage, and omitting low-pass filtering for the output signal of the open-gain trans-impedance amplifier.

11. An integrated circuit chip, comprising:
an open-gain trans-impedance amplifier having a programmable input impedance adjusted to match to an impedance of a transmission line between a photo diode and the open-gain trans-impedance amplifier, the transmission line and the photo diode being external to the integrated circuit chip, and a last stage of the open-gain trans-impedance amplifier providing voltage level shifting for an output single and for a common mode signal of the open-gain trans-impedance amplifier.

12. The integrated circuit chip of claim 11, wherein the programmable input impedance has a predetermined minimum value and a predetermined maximum value that ranges to cover variations of a transmission line impedance.

13. The integrated circuit chip of claim 11, wherein the open-gain trans-impedance amplifier comprises a common gate amplifier stage followed by two common source amplifier stages, wherein the open-gain trans-impedance amplifier comprises a low-pass filter to feed the common mode signal to a bias voltage of a first amplifier stage of the open-gain trans-impedance amplifier, and wherein low-pass filtering is omitted for the output signal of the open-gain trans-impedance amplifier.

14. The communication device of claim 1, wherein the common mode signal of the open-gain trans-impedance amplifier generates a common mode reference voltage for the open-gain trans-impedance amplifier output signal.

15. The communication device of claim 1, wherein the programmable input impedance has a predetermined minimum value and a predetermined maximum value that ranges to cover variations of a transmission line impedance.

16. The method of claim 7, further comprising:
generating a common mode reference voltage for the open-gain trans-impedance amplifier output signal.

17. The integrated circuit chip of claim 11, wherein the programmable input impedance is adjusted based on a control signal to a variable resistor, the control signal being based on analysis of an output signal of the open-gain trans-impedance amplifier.

18. The integrated circuit chip of claim 11, wherein the common mode signal of the open-gain trans-impedance amplifier generates a common mode reference voltage for the open-gain trans-impedance amplifier output signal.

* * * * *